United States Patent
Fujii (10) Patent No.: US 9,337,816 B2
(45) Date of Patent: May 10, 2016

(54) DELAY CIRCUIT USING CAPACITOR AS DELAY ELEMENT

(71) Applicant: FUJI ELECTRIC CO., LTD., Kawasaki-shi, Kanagawa (JP)

(72) Inventor: Masanari Fujii, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/556,906

(22) Filed: Dec. 1, 2014

(65) Prior Publication Data

US 2015/0214938 A1 Jul. 30, 2015

(30) Foreign Application Priority Data

Jan. 27, 2014 (JP) .................................. 2014-012596

(51) Int. Cl.
*H03K 3/00* (2006.01)
*H03K 5/13* (2014.01)

(52) U.S. Cl.
CPC ........................................ *H03K 5/13* (2013.01)

(58) Field of Classification Search
USPC ................. 327/261, 264, 285, 288, 392–393, 327/398–399
See application file for complete search history.

(56) References Cited

U.S. PATENT DOCUMENTS

| | | | | |
|---|---|---|---|---|
| 6,664,812 B2* | 12/2003 | Savage | ................. | H03K 5/1565 326/93 |
| 8,213,203 B2* | 7/2012 | Fei | .................... | H02M 3/33523 323/285 |
| 8,487,599 B2* | 7/2013 | Lee | ........................... | G05F 1/10 323/282 |
| 8,923,021 B2* | 12/2014 | Ren | ......................... | H02M 1/36 363/21.12 |
| 2001/0020861 A1 | 9/2001 | Hirose | | |

* cited by examiner

*Primary Examiner* — An Luu
(74) *Attorney, Agent, or Firm* — Manabu Kanesaka (57) ABSTRACT

A delay circuit using a capacitor with an MOS structure as a delay component, includes a clamp circuit operating a clamp operation and a clamp release operation in response to levels of an input signal, the clamp circuit clamping a voltage applied to the capacitor to a specified charging initiation voltage during the clamp operation; a charging circuit charging the capacitor with a constant current when the clamp operation is released; and a delayed signal producing circuit producing a delayed signal when the voltage of the capacitor being charged reaches a voltage of a predetermined value.

7 Claims, 5 Drawing Sheets

DELAY CIRCUIT USING CAPACITOR AS DELAY ELEMENT

CROSS-REFERENCE TO RELATED APPLICATION

The present application claims priority from Japanese Application No. 2014-012596 filed Jan. 27, 2014, the disclosure of which is incorporated herein.

FIELD OF THE INVENTION

The present invention relates to a delay circuit using a capacitor as a delay element.

BACKGROUND ART

In JP-2001-251171, a delay circuit is disclosed which uses a capacitor with an MOS (Metal-Oxide-Semiconductor) structure (hereinafter referred to as an MOS capacitor) of a p-channel type and an MOS capacitor of an n-channel type as delay elements.

As it will be explained later, an MOS capacitor has a characteristic of varying the capacitance thereof with a gate voltage (voltage dependence). Thus, when such an MOS capacitor is used as a delay element of a delay circuit, the influence on a delay time due to the voltage dependence of the MOS capacitor must be reduced.

Hence, in the delay circuit according to JP-2001-251171, a specified voltage beyond the range of a power supply voltage is provided so as to be applied to the substrate (back gate) of each of the MOS capacitors. Namely, the delay circuit is provided so that, with respect to the MOS capacitor formed of a p-channel MOSFET, a specified voltage higher than the power supply voltage is applied to the substrate, and with respect to the MOS capacitor formed of an n-channel MOSFET, a specified voltage lower than the grounding voltage (0V) is applied to the substrate. The value of each of the voltages applied to the substrate is set at a value at which the MOS capacitor exhibits a constant capacitance value whenever a voltage of any magnitude within the power supply voltage is applied to the gate of the MOS capacitor.

Patent Document 1

JP-A-2001-251171

As is described in the foregoing, in the delay circuit according to JP-2001-251171, a voltage beyond the range of the power supply voltage is applied to the substrate of each of the MOS capacitors. This requires power supply circuits for producing such voltages. Therefore, when a delay circuit including such power supply circuits is formed as an integrated circuit, a circuit to which a voltage within the range of the power supply voltage is applied and circuits to which voltages beyond the range of the power supply voltage are applied are to be presented together on a common semiconductor substrate. This requires such processing as to insulate the circuits from one another, which causes a decrease in design flexibility and an increase in complexity in the configuration of the delay circuit to result in an increased cost.

Accordingly, it is an object of the invention to provide a delay circuit which is capable of reducing the influence on a delay time due to the voltage dependence of the capacitance of an MOS capacitor without applying a voltage beyond the range of the power supply voltage to the MOS capacitor.

SUMMARY OF THE INVENTION

The invention achieves the object in the foregoing by providing a delay circuit using a capacitor with an MOS structure for a delay component, which includes a clamp circuit having a first MOSFET connected to the capacitor and operating a clamp operation and a clamp release operation in response to levels of an input signal, the clamp circuit clamping a voltage applied to the capacitor to a specified charging initiation voltage at the clamp operation, a charging circuit having a first constant current source connected to the capacitor and charging the capacitor with a first constant current when the clamp operation is released, and a delayed signal producing circuit having a second MOSFET connected to the capacitor and becoming a conduction state when the voltage of the capacitor being charged reaches a voltage of a predetermined value, and a second constant current source connected to the second MOSFET, and when the second MOSFET becomes conduction, producing a delayed signal with a voltage changed by the conduction at a connection point of the second MOSFET and the second constant current source, and simultaneously discharging the capacitor with a second constant current of the second constant current source to decrease a charging speed of the capacitor.

The clamp circuit can be provided with a source follower circuit to the input signal, which circuit is formed with the first MOSFET and the first constant current source. In this case, when the first MOSFET becomes a conduction state, the source follower circuit clamps the voltage of the capacitor at a voltage specified by the threshold voltage of the first MOSFET. Here, for the first MOSFET, a p-channel type MOSFET is used, for example.

The delayed signal producing circuit can be provided with a discharge circuit and a comparison circuit. The discharge circuit has the second MOSFET and the second constant current source connected in series to each other. The second constant current source discharges the capacitor through the second MOSFET in a conduction with the second constant current set smaller than the first constant current to thereby decrease the charging speed of the capacitor. The comparison circuit is connected to the connection point of the second MOSFET and the second constant current source. The comparison circuit compares a voltage inputted from the connection point and a threshold voltage, and when the inputted voltage exceeds the threshold voltage due to the conduction of the second MOSFET, produces a signal voltage, which is outputted as the delayed signal. For the second MOSFET, a p-channel type MOSFET applied with a reference voltage to the gate terminal thereof is used, for example.

As another form of the comparison circuit, it is formed of a CMOS logic circuit, for example.

According to the delay circuit of the invention, the circuit is capable of reducing the influence due to the voltage dependence of the capacitance of an MOS capacitor on a delay time without applying a voltage beyond the range of the power supply voltage to the MOS capacitor. Therefore, it is possible to increase the design flexibility of the delay circuit and simplify the configuration thereof.

DESCRIPTION OF THE PREFERRED EMBODIMENT

In the following, an embodiment of the invention will be explained with reference to attached drawings.

Figure 1:
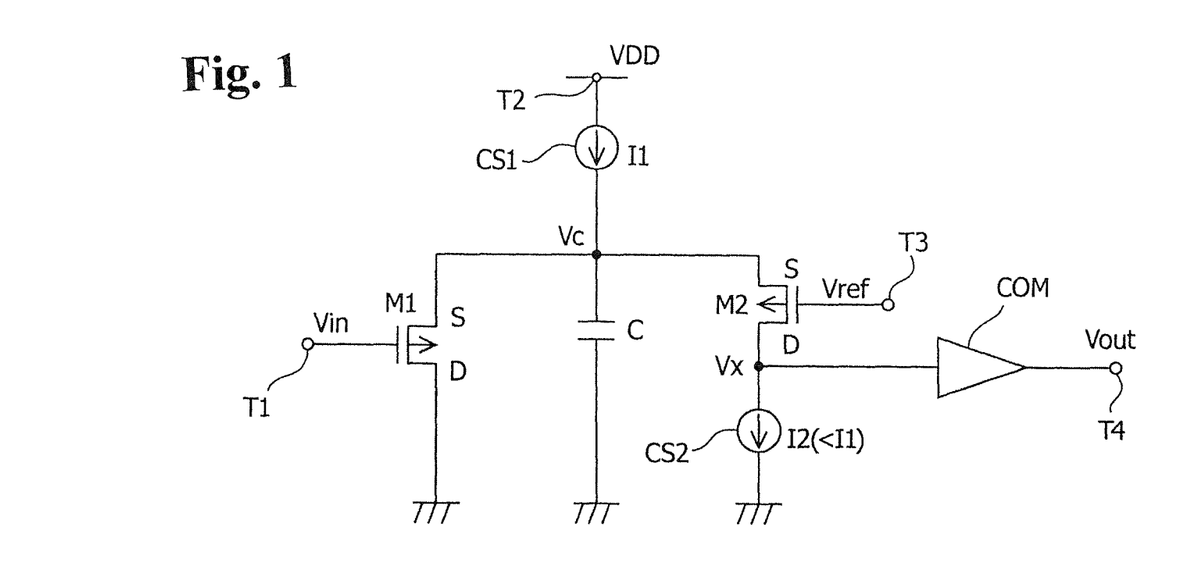
FIG. 1 is a circuit diagram showing the configuration of a delay circuit according to an embodiment of the invention.

FIG. 1 is a circuit diagram showing the configuration of a delay circuit according to an embodiment of the invention. The delay circuit is provided with a first switching element M1 formed of a first MOSFET (Metal-Oxide-Semiconductor Field-Effect Transistor) and a second switching element M2 formed of a second MOSFET each being a p-channel type, first and second constant current sources CS1 and CS2 producing first and second constant currents I1 and I2 (I1>I2), respectively, a capacitor C and a voltage comparator COM. The delay circuit is formed as an integrated circuit.

The first switching element M1 has a gate terminal connected to an input terminal T1 and has a drain terminal grounded. The first constant current source CS1, being provided for forming a charging circuit charging the capacitor C with a first constant current I1, has the one end thereof connected to a power supply terminal T2 and has the other end thereof connected to the source terminal of the first switching element M1 and the one end of the capacitor C. The other end of the capacitor C is grounded.

The second switching element M2 has a gate terminal connected to a reference voltage input terminal T3 and has a source terminal connected to the one end of the capacitor C. The second constant current source CS2, being provided for forming a charge circuit discharging the capacitor C with a second constant current I2 through the second switching element M2, has the one end thereof connected to the drain terminal of the second switching element M2 and the input terminal of the voltage comparator COM and has the other end thereof grounded. The output terminal of the voltage comparator COM is connected to an output terminal T4. Here, the first constant current I1 produced by the first constant current source CS1 is related to the second constant current I2 produced by the second constant current source CS2 by I1>I2.

Figure 2:
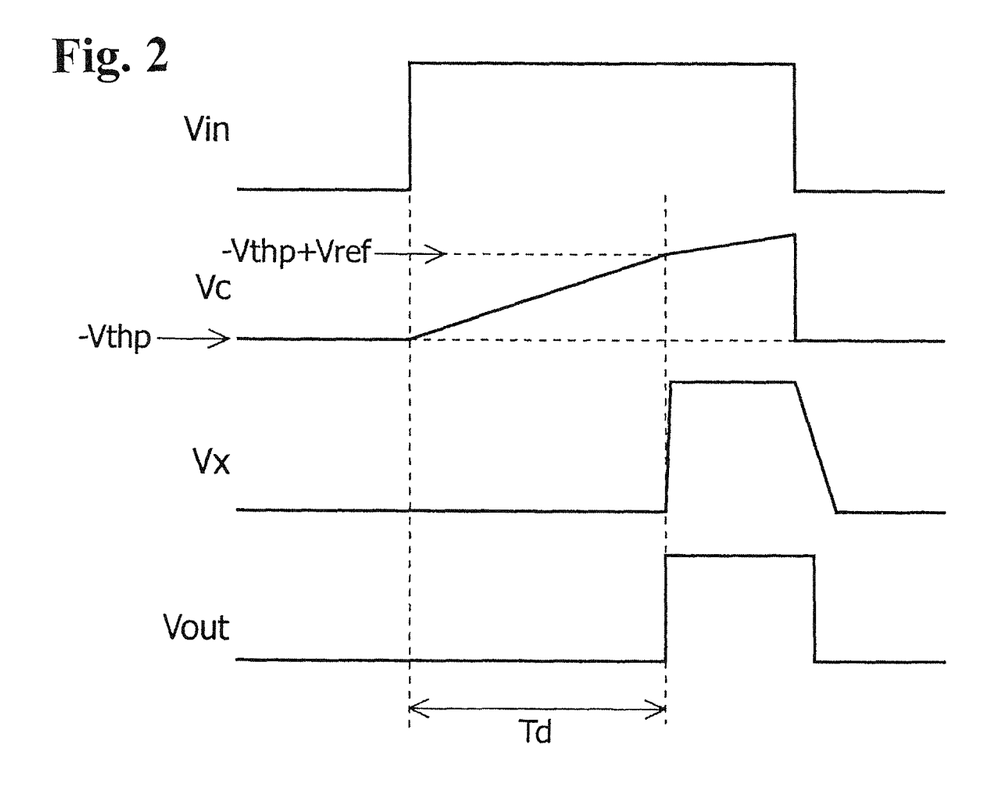
FIG. 2 is a timing chart showing the operation of the delay circuit shown in FIG. 1.

FIG. 2 is a timing chart showing the operation of the delay circuit shown in FIG. 1. In the following, the operation of the delay circuit according to the embodiment will be explained with reference to FIG. 2. In the following explanations, an L (Low) level is equivalent to zero volt (0V) and an H (High) level is equivalent to a power supply voltage VDD (3V in the embodiment) applied to the power supply terminal T2. In addition, the first and second switching elements M1 and M2, being formed in the same semiconductor substrate in a state of being in close proximity to each other, are to have a common threshold voltage Vthp at which each of the first and second switching elements M1 and M2 is in a conducting state or a cut-off state.

The first switching element M1, forming a source follower circuit with the source terminal connected to the first constant current source, is provided as a clamp circuit in which, if the input signal voltage at the input terminal T1 is to be Vin, the first switching element M1 operates together with the first constant current source so as to clamp the voltage Vc at the source terminal thereof at Vin+|Vthp|=Vin−Vthp. In the clamp circuit, when the input signal voltage Vin is at the L level, for example, the first switching element M1 is in a conducting state. Therefore, the voltage Vc is clamped at the threshold voltage |Vthp|=−Vthp. Since the threshold voltage Vthp is a negative voltage, the voltage Vc becomes a positive voltage. At this time, the second switching element M2 is in a cut-off state.

Here, the level of the input signal voltage Vin changed to the H level equivalent to the power supply voltage VDD brings the voltage clamped by the first switching element M1 to jump to VDD+|Vthp|, by which the first switching element M1 is cut-off. This releases the voltage Vc from the clamping operation by the first switching element M1 in the clamp circuit, by which charging of the capacitor C is initiated by the first constant current I1 from the first constant current source CS1 forming the charging circuit. The voltage Vc, becoming the charging voltage of the capacitor C, increases from −Vthp with the progress of the charging of the capacitor C.

The second switching element M2, the second constant current source CS2 and the voltage comparator COM form a delayed signal producing circuit that produces a delayed signal, of which the second switching element M2 and the second constant current source CS2 form a discharging circuit that is operated as follows.

The second switching element M2, having a reference voltage Vref (<<VDD) inputted to the gate terminal thereof through a terminal T3, initiates an operation as a source follower circuit to turn-on when the voltage Vc charging the capacitor C reaches Vref+|Vthp|. The turning-on of the second switching element M2 allows the second constant current source CS2 to flow the constant current I2 in the second switching element M2. The second constant current I2 becomes the discharging current from the capacitor C. As a result, the charging current of the capacitor C decreases from the first constant current I1 to I1−I2 to result in a decrease in the charging speed of the capacitor C.

While, with the turning-on of the second switching element M2, the voltage Vx at the drain terminal of the second switching element M2 increases rapidly while being pulled by the voltage Vc at the source terminal of the second switching element M2. That is, the voltage Vx at the drain terminal is the charging voltage of a parasitic capacitor connected to the drain terminal. The parasitic capacitor, having a minute capacitance value, is rapidly charged when the second switching element M2 is turned-on to rapidly increase the voltage Vx.

As a result, a current flowing in the second switching element M2 is, strictly speaking, to be a sum of the current flowing in the second constant current source CS2 and the current charging the parasitic capacitor.

In FIG. 2, although the voltage Vx has a constant value after the rapid increase, this is only one example. Some configurations of the second constant current source CS2 producing the second constant current I2 make the voltage Vx become not constant. For example, the voltage Vx sometimes becomes as Vx≈Vc, by which the voltage Vx can gradually increase with an increase in the voltage Vc.

The voltage comparator COM is provided as a comparison circuit that compares the voltage Vx with a specified reference voltage and outputs the result of the comparison as an output signal voltage Vout. In the embodiment, a CMOS logic circuit (inverter) is used as the voltage comparator COM. In this case, the reference voltage in the voltage comparator COM becomes the threshold voltage Vthc of the CMOS logic circuit. Therefore, when the voltage Vc becomes higher than the threshold voltage Vthc, the level of the output signal voltage Vout of the voltage comparator COM is inverted from the L level to the H level. As shown in FIG. 2, a delay time Td obtained by the delay circuit of the embodiment is a period from the time at which the level of the input signal voltage Vin is changed from the L level to the H level to the time at which the level of the output signal voltage Vout of the voltage comparator COM is inverted from the L level to the H level. That is, the output signal voltage Vout with the level thereof inverted to the H level is a signal outputted as a delayed signal.

Incidentally, for a capacitor used for an integrated circuit, a capacitor with an MOS (Metal-Oxide-Semiconductor) structure is preferably used. This is because a capacitor with an MOS structure (hereinafter referred to as an MOS capacitor) has the advantage of being capable of increasing a capacitance value per unit area compared with a capacitor formed with the use of polysilicon etc. under the same withstand voltage condition, that is, the advantage of being capable of reducing an area for securing the same capacitance to the order of a fraction of the area of the capacitor formed with the use of polysilicon etc.

Hence, in the delay circuit according to the embodiment, an MOS capacitor is used for the capacitor C.

As is generally known, an MOS capacitor has a structure in which a gate electrode, a capacitor formed with a gate oxide film and a capacitor formed thereunder with a semiconductor substrate having a depletion layer therein are connected in series.

Figure 3:
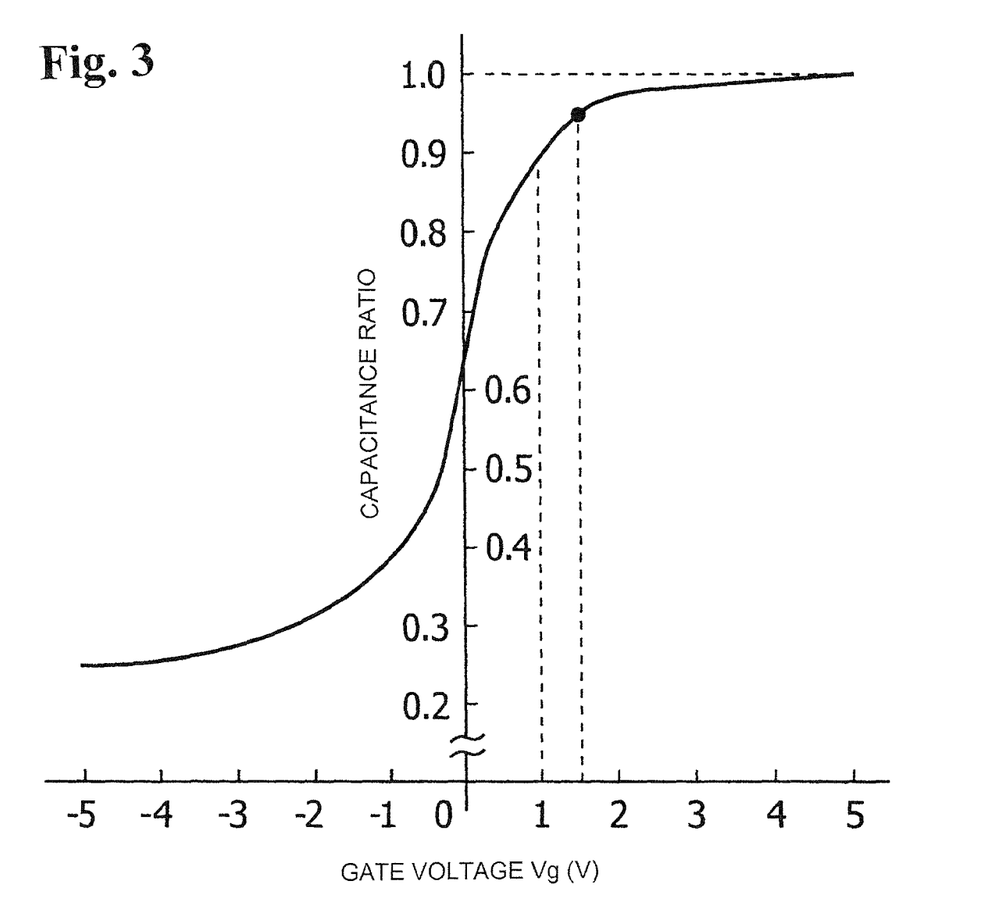
FIG. 3 is a graph showing an example of a relationship between a gate voltage and a capacitance ratio in an MOS capacitor using an n-channel MOSFET.

FIG. 3 is a graph showing an example of a relationship between a gate voltage Vg and a capacitance ratio in an MOS capacitor using an n-channel MOSFET. Here, the capacitance ratio is a ratio of a measured capacitance value of an MOS capacitor to the value of the saturated (maximum) capacitance as a design value. The capacitance value of the MOS capacitor is a differential capacitance value, which is measured at each of measured points of gate voltages with the gate voltage minutely varied. As is shown in FIG. 3, the capacitance of the MOS capacitor has voltage dependence. This is due to the fact that the capacitance of the capacitor having the depletion layer has voltage dependence.

In the delay circuit according to the embodiment, the voltage clamped at −Vthp by the first switching element M1 becomes the charging initiation voltage of the capacitor C formed of an MOS capacitor, which makes it possible to reduce the influence of the voltage dependence of the capacitance of the capacitor C on the accuracy of the delay time Td. In the following, the operation will be specifically explained.

For example, if the threshold voltage Vthp of each of the first switching element M1 and the second switching element M2 are to be −1.5V, the voltage Vc is clamped at −Vthp=1.5V when the first switching element M1 is in conduction. While, when the first switching element M1 is cut-off, the charging of the capacitor C is initiated by the first constant current I1 from the first constant current source CS1, by which the voltage Vc gradually increases from the foregoing clamp voltage of 1.5V (charging initiation voltage).

Here, if the reference voltage Vref for controlling the second switching element M2 is to be 1.0V, the second switching element M2 is in conduction when the voltage Vc reaches −Vthp+Vref=2.5V. Accompanied with this, the voltage Vx at the drain terminal of the second switching element M2 increases rapidly to be higher than the threshold voltage Vthc of the CMOS logic circuit in the voltage comparator COM to invert the output signal voltage Vout thereof.

In the delay circuit of the embodiment operating in this way, the effective capacitance of the capacitor C used for producing the delay time Td is the capacitance when the voltage Vc is increased from −Vthp=1.5V to −Vthp+Vref=2.5V. That is, the effective capacitance is that when the voltage Vc is in a region equal to or higher than 1.5V.

As is shown in FIG. 3, the MOS capacitor has low voltage dependence when the gate voltage Vg is in a region equal to or higher than 1.5V. Therefore, according to the delay circuit of the embodiment, although an MOS capacitor is used as the capacitor C, a decrease in accuracy of a delay time Td is avoided which is due to voltage dependence of the capacitance of the MOS capacitor.

Namely, according to the embodiment, the effective capacitance of the capacitor C necessary for increasing the voltage Vc from 1.5V to 2.5V is varied from 95% to 98% of the rated capacitance, for example, with the rate of variation becoming 3% (=(98−95)/98*100). That is, when the delay time Td is estimated with the effective capacitance when the gate voltage of the capacitor C is 2.5V, the maximum voltage in service, the error in the delay time Td due to the variation in the effective capacitance can be reduced to be equal to or less than 3%. Further, in a region with the voltage Vc equal to or more than 1.5V, variation in a capacitance value of the capacitor C with the variation in a voltage applied thereto is small. With this, the influence of the fluctuation in characteristics among semiconductor elements being used on a delay time is also made to be small to permit highly accurate estimation of a delay time.

In addition, according to the delay circuit of the embodiment, the following advantages can be obtained. That is, although the voltage comparator COM formed of a CMOS logic circuit exhibits large fluctuation in the threshold voltage Vthc (on the order of ±20%) due to influences of variations in the power supply voltage, temperature and fabrication process etc., in the delay circuit of the embodiment, the voltage Vx inputted to the voltage comparator COM increases rapidly from 0V to a voltage close to the voltage Vc (>Vthc) to make it possible to let the voltage comparator COM carry out a stable and highly accurate inverting operation without being affected by the fluctuation in the threshold voltage Vthc. Therefore, variations in the delay time Td due to the fluctuation in the threshold voltage Vthc can be reduced.

Figure 4:
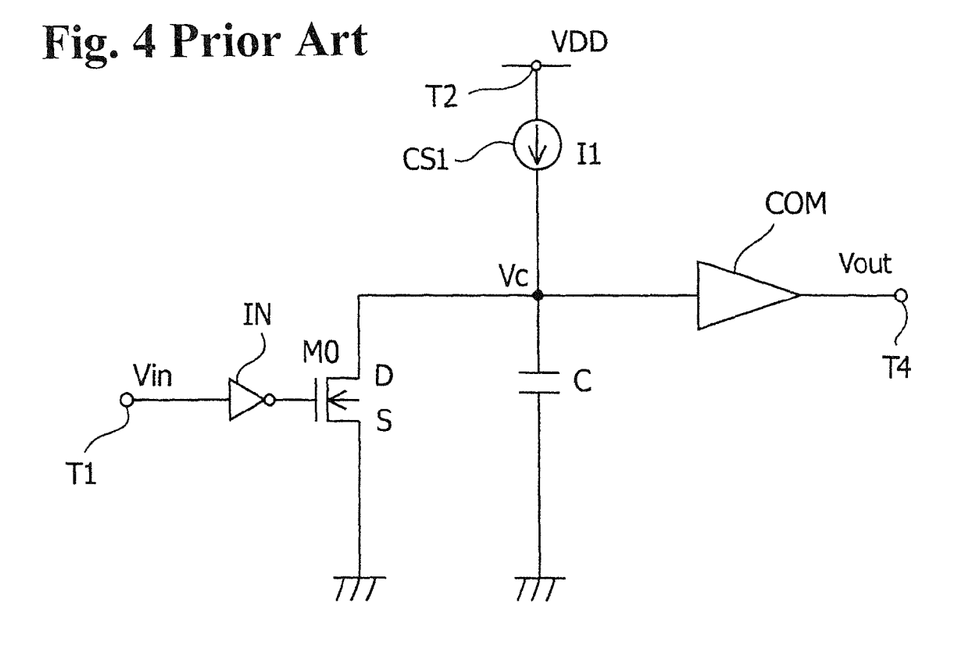
FIG. 4 is a circuit diagram showing the configuration of the delay circuit according to a comparative example.
Figure 5:
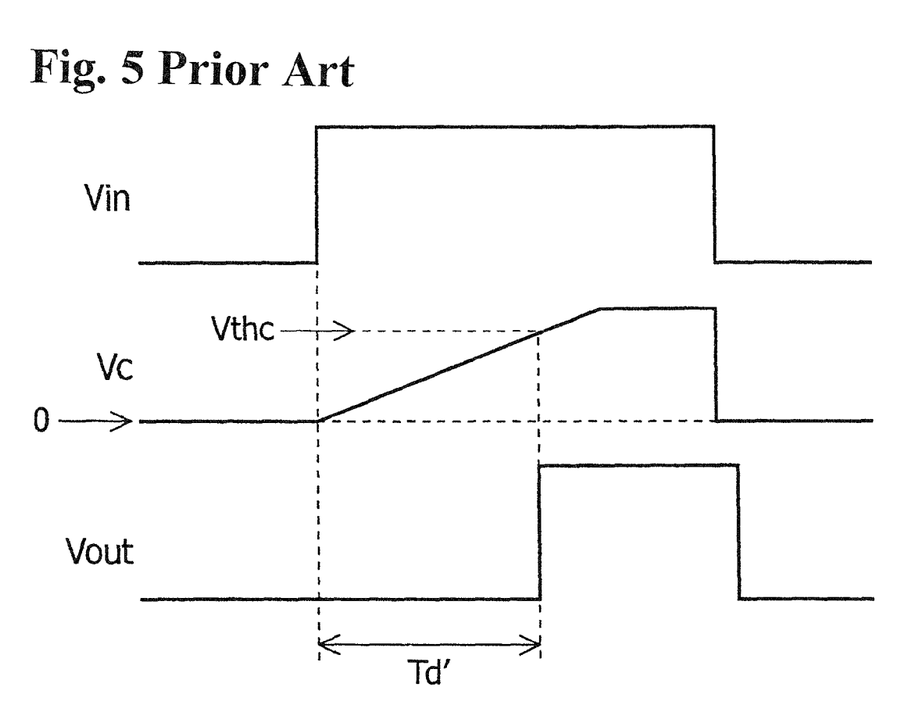
FIG. 5 is a timing chart showing the operation of the delay circuit according to the comparative example shown in FIG. 4.

FIG. 4 is a circuit diagram showing the configuration of the delay circuit according to a comparative example for being compared with the delay circuit of the embodiment according to the invention. The delay circuit according to the comparative example is an ordinary delay circuit, which differs from the delay circuit shown in FIG. 1 in that the first switching element M1 shown in FIG. 1 is replaced by a switching element M0 formed of an n-channel type MOSFET, that an inverter IN is inserted between an input terminal T1 and the switching element M0 and that the connection point of the capacitor C and the constant current source CS1 is directly connected to the input terminal of the voltage comparator COM formed of a CMOS logic circuit without the second switching element M2 and second constant current source CS2 being provided to form a delayed signal producing circuit. Evidently, even in the delay circuit, an MOS capacitor is used for the capacitor C. FIG. 5 is a timing chart showing the operation of the delay circuit according to the comparative example shown in FIG. 4. In the following, the operation of the delay circuit according to the comparative example will be explained with reference to FIG. 5.

When the level of an input signal voltage Vin is the L level (0V), the input signal voltage Vin at the L level is inverted to an H level signal by the inverter IN to be inputted to the gate terminal of the switching element M0, by which the switching element M0 is in a conducting state. Therefore, the voltage Vc, which is inputted to the voltage comparator COM from the connection point of the drain of the switching element M0, the first constant current source CS1, the capacitor C and the voltage comparator COM, is at 0V unlike the voltage Vc in the delay circuit according to the embodiment.

When the level of the input signal voltage Vin is changed from the L level (0V) to the H level (3V), an L level signal, to which the input signal voltage Vin at the H level is inverted, is inputted to the gate terminal of the switching element M0 to bring the switching element M0 to be cut-off. Accompanied with this, the charging of the capacitor C is initiated with the first constant current I1 from the first constant current source CS1. This gradually increases the voltage Vc from 0V which voltage is inputted to the voltage comparator COM. When the voltage Vc reaches the threshold voltage Vthc of the CMOS logic circuit forming the voltage comparator COM, the level of the output signal voltage Vout of the voltage comparator COM is inverted from the L level (0V) to the H level (3V).

As a result, the delay time Td' given by the delay circuit according to the comparative example becomes a period from the time at which the level of the input signal voltage Vin changed to the H level to the time at which the level of the output signal voltage Vout of the voltage comparator COM is inverted from the L level to the H level.

Here, if the threshold voltage Vthc is to be 1.5V, the delay time Td' becomes a period during which the charging voltage of the capacitor C reaches 1.5V from 0V. That is, the amount of the change in the voltage Vc specifying the delay time Td' is 1.5V.

As is shown in FIG. 3, the capacitance of an MOS capacitor has high dependence on the voltage in a region of a voltage defining the delay time Td', namely in a region in which the gate voltage Vg is between 0V and 1.5V. Therefore, in the delay circuit according to the comparative example, the voltage dependence of the capacitance of the capacitor C largely influences the accuracy of the delay time Td'.

Namely, in the delay circuit according to the comparative example, the effective capacitance of the MOS capacitor necessary for increasing the voltage Vc from 0V to 1.5V, which is the threshold voltage Vthc of the CMOS logic circuit in the voltage comparator COM that determines the delay time, varies, for example, from 65% to 95% of the rated capacitance with the rate of variation becoming as much as 32% (=(95−65)/95*100). That is, when a delay time is estimated with the effective capacitance when the voltage Vc applied to the gate of the MOS capacitor is 1.5V, which is equal to the threshold voltage Vthc that makes the output signal voltage Vout determining the delay time outputted from the voltage comparator COM, an error in the delay time due to fluctuation in the effective capacitance becomes large as being tens of percent. Moreover, the region in which the gate voltage Vg is from 0V to 1.5V is a region in which the value of the capacitance (capacitance ratio) greatly varies. In addition, the threshold voltage Vthc of the CMOS logic circuit of the voltage comparator COM fluctuates on the order of ±20% as was explained in the foregoing. Therefore, the influence of fluctuation in characteristics among semiconductor elements being used is also large to make it difficult to carry out highly accurate estimation of a delay time. This also becomes a major cause of the fluctuation in a delay time.

The delay circuit according to the comparative example also has the following problem. Namely, as is described in the foregoing, the voltage comparator COM formed of the CMOS logic circuit has fluctuation of the order of ±20% in the threshold voltage Vthc thereof. Hence, even though a highly accurate constant current source is used for the constant current source CS1, fluctuation in the delay time becomes ±20% or more.

As is apparent from the explanations in the foregoing, according to the delay circuit of the embodiment, the charging initiation voltage of the capacitor C formed of an MOS capacitor is set at a voltage specified by the threshold voltage of the switching element M1. Therefore, a highly accurate signal delay can be actualized with the use of the capacitance in a region with small voltage dependence in the capacitor C. Moreover, by the foregoing operation of the second switching element M2 provided between the capacitor C and the voltage comparator COM formed of the CMOS logic circuit, the fluctuation in a delay time can be reduced which is due to the fluctuation in the threshold voltage Vthc of the CMOS logic circuit.

In addition, for the voltage of the L level given to the first switching element M1, a constant voltage between 0V and the reference voltage Vref can be given instead of 0V.

While the present invention has been particularly shown and described with reference to the preferred embodiment thereof, it will be understood by those skilled in the art that the foregoing and other changes in form and details can be made therein without departing from the spirit and scope of the present invention.

What is claimed is:

1. A delay circuit comprising:
   a capacitor as a delay component;
   a clamp circuit having a first MOSFET connected to the capacitor and operating a clamp operation and a clamp release operation in response to levels of an input signal, the clamp circuit clamping a voltage applied to the capacitor to a predetermined charging initiation voltage at the clamp operation;
   a charging circuit having a first constant current source connected to the capacitor and charging the capacitor with a first constant current when the clamp operation is released; and
   a delayed signal producing circuit having a second MOSFET connected to the capacitor and becoming a conduction state when the voltage of the capacitor being charged reaches a voltage of a predetermined value, and a second constant current source connected to the second MOSFET; when the second MOSFET becomes conduction, producing a delayed signal with a voltage changed by the conduction at a connection point of the second MOSFET and the second constant current source; and simultaneously discharging from the capacitor a second constant current of the second constant current source to decrease a charging speed of the capacitor.

2. The delay circuit according to claim 1, wherein the clamp circuit further comprises a source follower circuit to the input signal, the source follower circuit being formed with the first MOSFET and the first constant current source, and
   when the first MOSFET is in a conduction state, the source follower circuit clamps the voltage of the capacitor at a voltage defined by a threshold voltage of the first MOSFET.

3. The delay circuit according to claim 2, wherein the first MOSFET is a p-channel type MOSFET.

4. The delay circuit according to claim 1, wherein the delayed signal producing circuit further comprises:
   a discharge circuit having the second MOSFET and the second constant current source connected in series to each other, the second constant current source discharging the capacitor through the second MOSFET in a conduction with the second constant current set smaller than the first constant current to thereby decrease the charging speed of the capacitor; and
   a comparison circuit connected to the connection point of the second MOSFET and the second constant current source, the comparison circuit comparing a voltage inputted from the connection point and a threshold voltage, and producing a signal voltage outputted as the delayed signal when the inputted voltage exceeds the threshold voltage due to the conduction of the second MOSFET.

5. The delay circuit according to claim 4, wherein the second MOSFET is a p-channel type MOSFET applied with a reference voltage to the gate terminal thereof.

6. The delay circuit according to claim 4, wherein the discharge circuit is structured to alter a discharge current to a constant current.

7. The delay circuit according to claim 4, wherein the comparison circuit is formed of a CMOS logic circuit.

* * * * *